United States Patent [19]

Randall et al.

[11] Patent Number: 4,486,707

[45] Date of Patent: Dec. 4, 1984

[54] GAIN SWITCHING DEVICE WITH REDUCED ERROR FOR WATT METER

[75] Inventors: Bruce E. Randall, Alpharetta; Jay K. Marshall, Marietta, both of Ga.

[73] Assignee: Sangamo Weston, Inc., Atlanta, Ga.

[21] Appl. No.: 423,399

[22] Filed: Sep. 24, 1982

[51] Int. Cl.³ ............................................. G01R 7/00
[52] U.S. Cl. ................................................ 324/142
[58] Field of Search ...................... 324/107, 130, 142; 328/165; 330/9; 340/347 CC; 364/842

[56] References Cited

U.S. PATENT DOCUMENTS 3,746,851  7/1973  Gilbert ................................. 364/842
4,058,768 11/1977  Milkovic .
4,066,960  1/1978  Milkovic .
4,093,592  5/1978  Milkovic .
4,139,896  2/1979  Finger .
4,337,456  6/1982  Deffendall et al. .......... 340/347 CC
4,380,005  4/1983  Debord et al. ............... 340/347 CC

*Primary Examiner*—Stewart J. Levy
*Attorney, Agent, or Firm*—Dale Gaudier

[57] ABSTRACT

A gain switching apparatus for a signal is controlled by a switching function formed as a function of the signal. The apparatus is provided with a circuit for reducing errors due to common frequency components in the switching function and in the signal being switched thereby. In order to reduce DC error resulting from multiplication of the switching function by a parameter representing the switched signal, the common frequency component of the switching function is substantially eliminated and replaced by a component at a frequency which is a multiple of the common frequency. A simplified logic circuit is provided to perform the frequency multiplication and the resultant error reduction.

23 Claims, 5 Drawing Figures

GAIN SWITCHING DEVICE WITH REDUCED ERROR FOR WATT METER

TECHNICAL FIELD

This invention relates to watt hour apparatus for switching a signal to pass through paths having different gain characteristics, and more particularly to such apparatus including therein structure for reducing errors caused by interaction of common frequency components present in the signal and in a switching function used to determine the path for the signal.

BACKGROUND ART

Electronic instruments for measurement electrical energy are known in the art. In such instruments, it is known to use electronic components for measurement of analog electrical parameters, such as current and voltage, and for conversion of the analog quantities to digital signals. The use of digital circuitry enables the resultant digital signals to be multiplied with great accuracy, thereby to provide accurate representations of the electrical energy transfer rate in a circuit.

The conversion of analog signals to digital values is typically achieved by analog-to-digital converters. Such converters are capable of providing accurate digital signals representative of the analog input value, for adjustable ranges of peak or average values of the input parameters. Accordingly, prior art circuits require manual intervention to change the range of measurement in accordance with the parameter values. Alternatively, auto-ranging electrical systems are known wherein different ranges of measurement are automatically determined by internal circuitry, the specific range being shown to the user by a visual display, for example. Such auto-ranging systems are typically responsive to peak or average values of alternating electrical parameters. These devices, however, do not address the question of providing accurate instantaneous conversion of the low magnitudes of a high range alternating electrical quantity, such as typically found in the vicinity of the zero crossings thereof Moreover, in prior art systems utilizing electronic signals it is known that various offset voltages of electronic components tend to result in inaccuracies. In the prior art there are provided suggestions for overcoming such offset errors. In one approach, described in U.S. Pat. No. 4,058,768, for example, errors caused by offset are averaged out utilizing a complicated system. Therein is proposed the phase switching of voltage variable signals and of a polarity detector whenever an output pulse is generated, thereby to average out offset caused errors. An integrator is caused alternately to integrate upwardly or downwardly, at a repetitious cycle having a frequency substantially higher than the frequency of the electrical parameter being measured. The patent, however, fails to address the issue of inaccurate instantaneous conversions in the zero crossing area. Moreover, the correction of errors due to interaction between common frequency components of a switching function and of a signal being measured is similarly not addressed, whether such errors are due to offset voltages or to other causes.

There is thus a need to provide structures for correcting internal errors in an electronic measurement apparatus due to interactions between the signal being measured and a switching function used in measurement of the signal. Moreover, there is a need to provide correction for inaccurate instantaneous conversions of analog values for signals having wide instantaneous variations although remaining in a particular measurement range.

DISCLOSURE OF THE INVENTION

It is accordingly an object of the present invention to overcome the difficulties of the prior art and to provide apparatus for reducing errors resulting from interaction between common frequency components of a switching function and a signal being operated on by said switching function.

It is another object of the invention to provide a gain switching arrangement for a varying input signal as a function of the instantaneous value of that signal and for causing the signal to be conveyed through alternate paths having different gains therefor.

It is a more specific object of the invention to provide an apparatus for generating a switching signal responsive to an input signal, and to provide means for reducing errors caused by interactions between common frequency components of the switching signal and the input signal.

Still another object of the invention is the elimination of a DC error resulting from interactions between two signals having common frequency components by doubling the frequency of one of the components.

In accordance with the objects of the invention, there is accordingly provided an error reducing means for reducing errors resulting from interactions between common frequency components of a switching function, applied in a switching apparatus to an input signal, and the input signal In a broad sense, the invention includes a first means for receiving the switching function and a second means for receiving another function. Additionally, there is provided a combining means for combining the switching function with the other function to produce as a result a substitute switching function substantially devoid of the common frequency component and, instead, having a substitute component at a substitute frequency which, upon interaction with the input signal component of the common frequency, results in a reduced error signal, as compared with the error generated by the original switching function.

Preferably, the reduction in error signal is achieved by changing the switching function to include components at multiples of the common frequency, but not at the common frequency itself. The multiple frequency components of the substitute switching function are generated by a structure providing both the switching function and a delayed version thereof. The delay is provided via a delay means which is selected to provide a delay equivalent to a submultiple of the period of the common frequency. Thus, by using a delay of one half the period of the common frequency, the resultant substitute switching function includes two repetitions of the original switching function in each cycle. That is, a double frequency switching function is obtained.

In accordance with another feature of the invention, there is provided an analog-to-digital converter which receives the input signal after its switched passage through one of two alternate paths and its amplification at one of two different gain levels thereby. A multiplier operates on digital signals output by the analog-to-digital converter. The multiplier further receives a signal from the structure used to generate the substitute switching function in order properly to scale the resultant product as a function of the appropriate gain provided to the input signal.

Preferably, the analog-to-digital converter receives both voltage and current signals, the multiplier thus providing an output product indicative of the power associated with the voltage and current.

In accordance with another feature of the invention, the generating structure for the switching function includes a comparator for determining the instantaneous amplitude of the input signal and a latching circuit, or flip-flop, for retaining the result of the comparison for a predetermined time period. The output of the latch circuit is provided to an OR gate, as well as to a shift register functioning as the delay used in generating the substitute switching function. The output of the shift register is combined in the OR gate with the output of the latch circuit to generate the substitute switching function.

In accordance with another aspect of the invention, there is described a gain switching arrangement for providing a plurality of gains to a varying input signal. The arrangement includes a plurality of paths for conveying the input signal therethrough at differing gains. Switching means is included for selectively switching the input signal through the plurality of paths, while a control means generates a switching signal to control the switching means. The control means includes a comparator for comparison of an instantaneous value of the signal with a threshold, and a circuit responsive to the comparator for providing the switching signal output by the control means. Preferably, there is provided an operational amplifier whose output is input to the comparator.

The error reducing feature of the invention is achieved as previously described by providing to the output signal of the comparator a delay corresponding to a submultiple of a frequency present in the switching signal and in the input signal. The comparator output signal and its delayed version are combined to produce a double frequency representation thereof, thus eliminating the common frequency with the inputsignal which otherwise results in a DC error.

In yet another feature of the invention, there is provided a sample and hold circuit for selective provision of samples of two input signals to the analog-to-digital converter so that a single converter provides digital values representative of the signals, preferably current and voltage signals. The outputs of the converter are provided to a multiplier, as is a control signal indicative of the specific gain provided to the input signal, thereby to result in an appropriately scaled output signal from the multiplier representing electrical power associated with the voltage and current.

Still other objects and features of the present invention will become more readily apparent to those skilled in the art from the following description when read in conjunction with the accompanying drawing, wherein there is shown and described a preferred embodiment of the invention simply by way of illustration of one of the best modes contemplated for carrying out the invention. As will be realized, the invention is capable of other, different, embodiments and its several details are capable of modifications in various obvious aspects, all without departing from the invention. Accordingly, the drawings and descriptions will be regarded as illustrative in nature and not as restrictive.

BRIEF DESCRIPTION OF THE DRAWING

The accompanying drawings, incorporated in and forming a part of the specification, illustrate several aspects of the present invention, and, together with the description, serve to explain the principles of the invention. In the drawings.

BEST MODE FOR CARRYING OUT THE INVENTION

Figure 1:
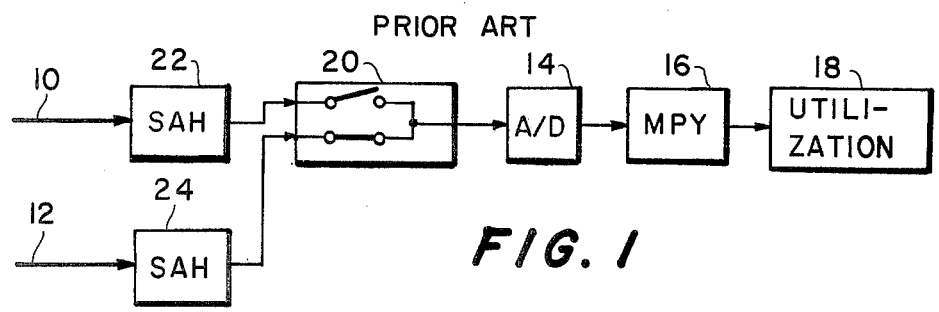
FIG. 1 illustrates a prior art switching apparatus useful in measurement of electrical power.

Typical prior art measurement of electrical power is illustrated by the structure in FIG. 1. As shown therein, electrical voltage and current signals are input at leads 10 and 12, respectively. The voltage and current are represented by analog values which, after conversion to digital form in an analog-to digital converter (ADC) 14 are multiplied in a multiplier 16. The resultant product is provided to a utilization device 18 which typically includes a display.

The arrangement of FIG. 1 shows the use of a single ADC to convert both the voltage and current signals. Such an approach is enabled by use of a controlled switch 20, effectively multiplexing the voltage and current signals for input to the ADC. Not shown in the circuit is a pair of storage devices which may be necessary for storing the digital output of ADC 14 to provide a simultaneous multiplier and multiplicand to multiplier 16. Of course, if two ADC units are used, the controlled switch 20 is not required and the voltage and current signals are provided directly to the converters.

In order to assure that the voltage and current signals are accurate representations of contemporaneous electrical parameters, there is provided a pair of synchronized sample-and-hold units 22 and 24. Moreover, although the circuitry in FIG. 1 illustrates a single pair of input terminals for voltage and current, the structure is equally applicable to multi-phase systems by utilization of a multiplexer (not shown) for periodically sampling the voltage and current of each of the phases, and providing signals representative of the same on leads 10 and 12.

A problem with the prior art structure shown in FIG. 1 is that the analog-to-digital converter 14 has a limited input operating range within which accurate conversion may be obtained. Thus, independently of the range of input parameters to which the device is set, it will be appreciated that for alternating current signals there will be a portion of the signal cycle for which the input signals have low instantaneous magnitudes. Thus, power determination in the vicinity of the zero crossings of the current or voltage waveforms will not be as accurate as those obtained during the higher magnitude instantaneous values of the input waveforms.

Figure 2:
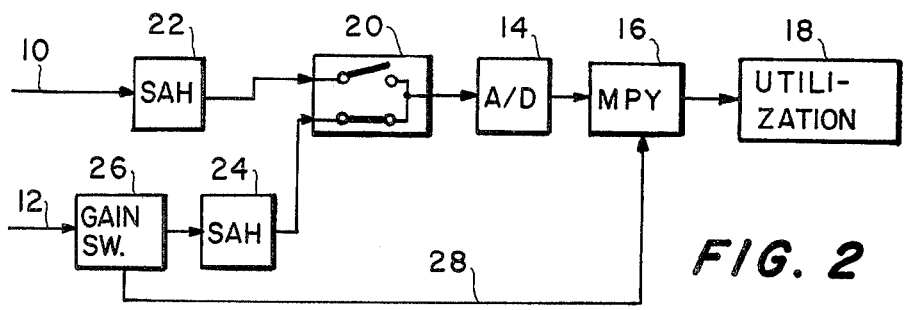
FIG. 2 illustrates an improvement of the prior art apparatus of FIG. 1 in accordance with the present invention.

In order to overcome this deficiency in the prior art, there is thus provided a modification of the structure in FIG. 1 as shown in FIG. 2. More specifically, as seen in FIG. 2 there is provided a gain switching network 26 in the path of the input current lead 12. It is the function of the gain switching network 26 to provide an increased amplitude of the current for conversion in ADC 14 when the instantaneous current magnitudes are low. Thus, ADC 14 provides a more accurate digital representation of the current during those instants of time when its magnitude is low, in order to provide a more accurate product by multiplier 16. Of course, in order to retain the appropriate scale for the product, multiplier 16 is required to undo the effects of the amplification of the instantaneous current magnitude by gain switching network 26. Towards that end, a control signal is provided by gain switching network 26 on a lead 28. The signal indicates to multiplier 16 the specific gain provided by network 26 to the current signal on lead 12.

For simplicity in operation, where multiplier 16 may represent a function performed by a microprocessor, or by another binary coded device, gain switching network 26 may provide different gains representable by different powers of 2. Multiplier 16 may then simply compensate for different gains provided to the current by shifting the binary point of its output product.

The system of FIG. 2 illustrates a single gain switching network 26 in the current lead. It should be appreciated, however, that a similar network may be provided in the voltage lead 10. However, inasmuch as typical power measurements are made with a fixed voltage (e.g., 115 volts at 60 Hz) and with varying current, the voltage conversions will be of sufficient accuracy. Inasmuch as the current value may change, however, and its instantaneous value is thus not predictable, the preferred embodiment of the invention contemplates compensation of the reduced accuracy of an ADC only for the current values.

Figure 3:
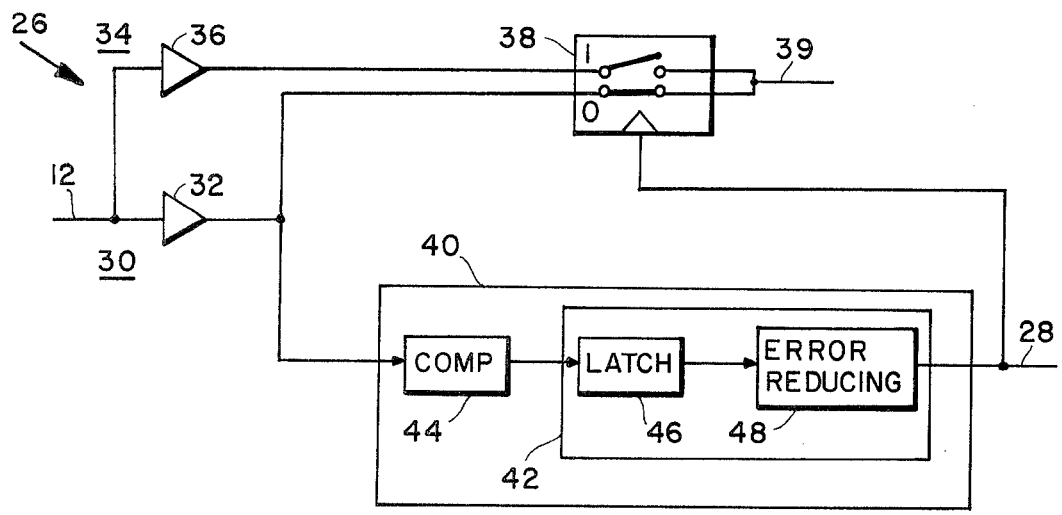
FIG. 3 shows a block diagram of the inventive improvement shown in FIG. 2.

Referring now to FIG. 3, the gain switching network 26 is shown in greater detail in order further to explain the operation of the invention. As shown in the figure, there is provided for the input signal on lead 12 a first path 30, having a first gain therein, symbolically represented by an amplifier 32, and a second path 34, having a second gain represented by an amplifier 36. It should be appreciated that the illustration of two alternate paths for the input signal is illustrative only. That is, there may be provided a larger number of alternate paths for the input signal. The specific gain given to the input signal prior to its passage to ADC 14 is determined by the instantaneous value thereof. Thus, where ADC 14 (or other utilization apparatus receiving the output of gain switching network 26) includes a number of operating ranges, each requiring a separate signal amplitude for proper operation, it is clear that a number of such paths, with an appropriate number of gain factors provided therein, may be used in the invention.

The signals passed by the first and second paths are provided to a controlled switch 38, which provides an output on its output lead 39 to the sample-and-hold circuit 24 shown in FIG. 2. A control circuit 40 is provided for controlling switch 38 in order to pass the input signal after amplification in path 1 or path 2 to the ADC.

In accordance with the preferred embodiment, the control circuit 40 includes a signal providing circuit 42, for providing a switching function control signal for switch 38. Additionally, control circuit 40 includes a comparator 44. The comparator is used to compare the input signal (either directly or, as shown in FIG. 3, after amplification in one of the paths) with a threshold to determine which gain should be provided to the signal prior to its passage through control switch 38 to the utilization device represented by ADC 14. Upon determination of the appropriate gain, comparator 44 causes circuit 42 to provide a control signal for switch 38 in order to switch the appropriate path into the circuit.

Preferably, the circuit 42 for providing a signal to the controlled switch 38 and to the multiplier 16 includes a latch 46 for temporarily storing the results of the comparison conducted at comparator 44. The output of latch 46 may be used directly to provide the desired output switching function and the output control signal to multiplier 16. However, such a connection may lead to an error for the following reason.

Ideally, for a situation wherein ADC 14 is set to accept 60 Hz signals of a particular (high) signal range, the instantaneous signal magnitude is at low levels requiring further amplification (in the vicinity of a zero crossing) at a 120 Hz rate. Thus, the output of latch 46 should include only a 120 Hz component, and should not include a 60 Hz component. However, because of possible asymmetries in the input waveform, in the offset voltages in the positive and negative comparisons conducted at comparator 44, or because of differences in offset voltages in paths 30 and 34, a 60 Hz component may be included in the switching signal output by latch 46. This component thus affects the switching of switch 38 and provides a 60 Hz error component on output lead 39. Since this signal is ultimately multiplied in multiplier 16 by a voltage signal having the same frequency, the result of the multiplication may include an appreciable DC error.

It is known that a multiplication of signals of two frequencies results in signals having sum and difference frequency components. Where the two multiplied signals include a common frequency component, the difference frequency component is thus at zero, or DC frequency. Accordingly, the present invention includes an error reducing circuit 48 within the circuit 42 providing the output switching function. It is the function of error reducing circuit 48 to provide a substitute switching function for the function output by latch 46, wherein the substitute function is substantially devoid of components at the common input frequency, thus reducing or eliminating the DC error hereinabove described. Thus, rather than providing the switching function generated in latch 46 to switch 38 and to multiplier 16, the inventive circuit substitutes a switching function at a substitute frequency, so that the interaction with the 60 Hz input frequency will not result in the undesirable DC component.

Figures 4, 5:
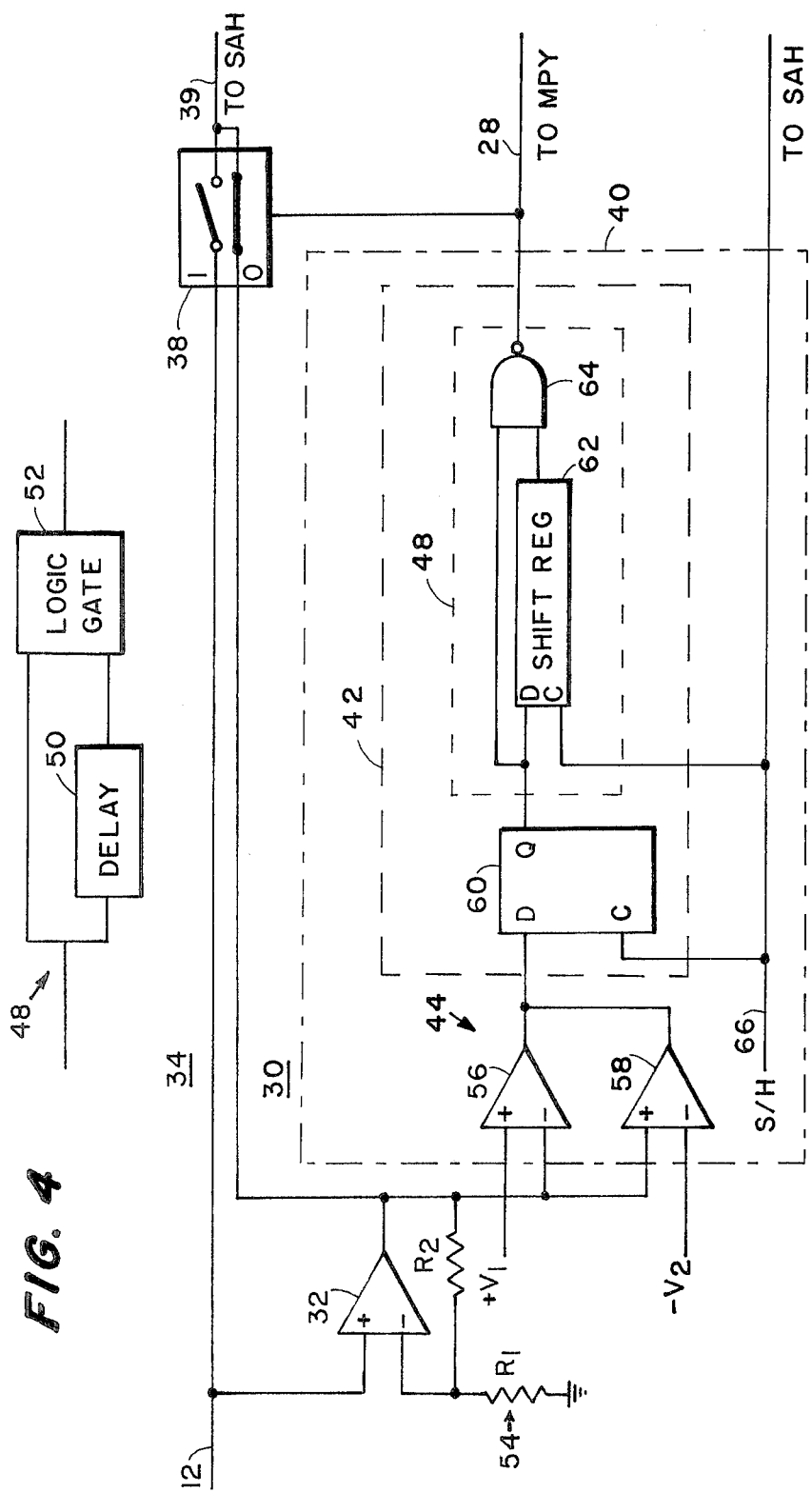
FIG. 4 provides a block diagram representation of a portion of the structure in FIG. 3.
FIG. 5 shows a detailed logic diagram of the structure of FIG. 3.

Referring now to FIG. 4, the error reducing circuit 48 is shown to include a delay circuit 50 and a logic gate 52 for providing the substitute switching function. The output of latch 46 is input to the delay circuit 50, and combined with the output of delay circuit 50 in logic gate 52 to provide the substitute switching function.

In operation, delay circuit 50 is selected to provide a delay of ½ period of the offending common frequency. Thus, where it is desired to eliminate a 60 Hertz component, an 8.33 millisecond delay is provided. By combining the output of latch 46 with its output ½ cycle previous thereto, there results at the output of logic gate 52 a signal of a frequency double the undesired frequency. That is, logic gate 52 outputs a switching function at twice the frequency of the function output by latch 46, and any errors therein are similarly provided at double frequencies. Thus, a 60 Hz error component in the switching function, due to the various offset voltages for example, is replaced by a 120 Hz waveform in the substitute switching function generated by logic gate 52. Subsequent correlation between the signal passed by switch 38 and the 60 Hz input voltage signal might thus result in an easily ignored 60 Hz error component, but without the objectionable DC error. It should be understood that instead of being delayed by ½ the period of the frequency common to the input signal and the switching function, the output function of the latch may be delayed by an appropriate plurality of any submultiple of the period of the common frequency. For example, to provide a tripling of the output error frequency the error reducing circuit may be altered to provide logic gate 52 with three inputs originating at the latch output. A first input would be passed through a delay circuit of ⅓ the common period, a second input would be provided a delay of ⅔ of the common period, and the third input would be the direct output of the latch itself. As will be appreciated, this approach results in tripling of the frequencies in the output of the latch circuit.

Referring now to FIG. 5, there is shown a logic diagram illustrating in detail the preferred embodiment of the present invention. Preferably, the gain of path 34 is unity and the gain of path 30 is represented by a circuit arrangement 54 wherein the gain of operational amplifier 32 is adjusted by resistors R1 and R2 to equal a power of 2, such as 8, in accordance with the previous description. The output of operational amplifier 32 is provided to a pair of comparators 56 and 58 which form the structure shown as comparator 44 in FIG. 3.

Comparators 56 and 58 provide output signals indicative of whether the output of amplifier 32 is within or without a range between $+V_1$ and $-V_2$. Typically, $V_1 = V_2$, so that for values of the input signal in a symmetric low range the signal is amplified by amplifier 32 prior to passage through switch 38 to the ADC.

Operation of the circuit thus provides for control of switch 38 to pass the input signal to the sample-and-hold circuitry 24 when its instantaneous amplitude is sufficiently high. When the amplitude is low, however, and is within, a predetermined range, the signal passed to sample-and-hold circuit 24 is the amplified version of the input signal, as provided by operational amplifier 32. The determination of whether the input signal is within or without the predetermined range is made by comparators 56 and 58, each of which provides a high level output signal when the input signal is within the low range. The resultant low level overrange signals output by the open collector output circuits of the comparators are wire OR'ed to provide a high level input signal to a D-type flip-flop 60 only when the input signal is within the low range requiring increased gain. The output of flip-flop 60 is provided to the data input of a shift register 62, performing the function of delay circuit 50 in FIG. 4. The shift register output and the flip-flop output are both input to a NAND circuit which provides a high level control signal for the switching circuit whenever either input thereto is low.

Thus, the controlled switch 38, which may be a type DG 303, manufactured by Siliconix, for example, provides a closed switch for path 34 if the input signal is now, or was ½ period previously, beyond the low level range. Alternatively, the signal on path 30 is passed to the ADC if the input signal is now, and was ½ period previously, within the low level range requiring additional amplification.

Preferably, the flip-flop 60, the shift register 62, and the sample-and-hold units 22 and 24 are clocked by a common signal provided on lead 66. The shift register is selected to have an appropriate number of stages to store a sequence of outputs of the flip-flop covering half the common period at the clock rate of the signal on lead 66.

Where a microprocessor is used to perform the multiplication function, as well as to control sequencing of operations in the circuit, the substitute switching function output by control circuit 40 on lead 28 may be applied to an interrupt line thereof. Thus, since a low value on line 28 is indicative of provision of a signal to the ADC which represents an amplified version of the input signal, the presence of a low level on line 28 may be used to trigger the microprocessor (not shown) to correct for the gain of amplifier 32. Where the gain of amplifier 32 is eight, the microprocessor will provide a product after a leftward shift of the binary point by three binary places.

Although the invention has been described in terms of a watt-hour environment, it should be appreciated that the described structure as recited in the claims is applicable in other environments as well. Thus, in addition to providing a reduced gain switching function for a watt-hour meter, the present invention more broadly provides an error reducing apparatus for environments wherein a switching function is generated as a function of a particular input signal, and results in a component having a common frequency with the input signal. By changing the frequency of the switching function components, errors due to correlation of the frequency component with similar components of the input signal are thus reduced.

The foregoing description of the preferred embodiment of the invention has been presented for purposes of illustration and description and is not intended to be exhaustive or to limit the invention to the precise form disclosed, since many obvious modifications and variations are possible in light of the above teaching. The embodiment was chosen and described in order best to explain the principles of the invention and its practical application, thereby to enable others skilled in the art best to utilize the invention in various embodiments and with various modifications as are suited to the particular use contemplated. It is intended that the scope of the invention be defined by the claims appended hereto, when interpreted in accordance with the full breadth to which they are fairly and legally entitled.

We claim:

1. In a switching apparatus for generating a switching function for controlling an input signal having at least a first component of a first frequency, said switching function having an error component at a frequency related to said first frequency, error reducing means for reducing errors resulting from interaction between said first component of said input signal and said error component of said switching function, said error reducing means comprising:

first means for receiving said error component of said switching function, second means for receiving another function, and combining means connected to said first and second means for combining said error component of said switching function and said another function to produce a second switching function having a reduced presence of said error component of said switching function and having a second component of a second frequency having a relationship to said first frequency different from the relationship of said frequency of said error component to said first frequency, said combining means providing said second switching function to said switching means thereby reducing errors due to interaction between said first component of said input signal and said error component of said switching function.

2. An error reducing means as recited in claim 1 wherein the frequency of said error component of said switching function is substantially identical with said first frequency, and further comprising delay means for delaying said error component of said switching function by a predetermined amount and for providing the delayed error component to said second means as said another function.

3. An error reducing means as recited in claim 2 wherein said combining means includes output means for outputting said second switching function to control application of switching means to said input signal.

4. An error reducing means as recited in claim 2 wherein said delay means is operative to delay the error component of said switching function by a submultiple of the period of said first frequency, said combining means including means for replacing said error component of said switching function by a combination of said error component and the delayed error component, thereby providing said second component with a second frequency which is a multiple of said first frequency.

5. An error reducing means as recited in claim 4 including switching means connected for varying gain of a path transmitting a further signal for measurement.

6. An error reducing means as recited in claim 5, the apparatus further comprising analog-to-digital converting means receiving said input signal, and said further signal from said path, for providing digital signals representative thereof.

7. An error reducing means as recited in claim 6, further comprising multiplying means receiving digital signals output from said analog-to-digital converting means and receiving a scaling signal from said output means indicative of the gain provided to said further signal.

8. An error reducing means as recited in claim 7, wherein said analog-to-digital converting means includes input means connected to receive said input signal and said further signal.

9. An error reducing means as recited in claim 8, wherein said input means is connected for receiving voltage and current signals, and
said multiplying means includes output means for providing an indication of power associated with said voltage and current.

10. An error reducing means as recited in claim 1 including generating means generating said switching function responsively to said input signal as a switch control signal at a frequency dependent upon and substantially identical to said first frequency, said generating means connected to provide said switch control signal to said first means,
said error reducing means including a time delay means, having an input connected to receive said switch control signal and an output connected to said second means, for delaying said switch control signal by an amount substantially equal to half the period of said first frequency,
said combining means comprising logic means for combining said switch control signal with the output of said time delay means from said first and second means, respectively, to replace said switch control signal by a substitute switch control signal having a frequency substantially equal to twice said first frequency.

11. An error reducing means as recited in claim 10 wherein said generating means comprises comparator means responsive to said input signal for providing a comparison signal indicative of an instantaneous amplitude thereof.

12. An error reducing means as recited in claim 11 wherein said generating means further comprises latching means for retaining the value of said comparison signal for a controlled period of time and for outputting said switch control signal at said first frequency.

13. An error reducing means as recited in claim 12 wherein said delay means comprises shift register means having a first input for receiving an output of said latching means and a second input for receiving a shifting signal, said shift register means having a predetermined number of stages selected to provide, in conjunction with said synchronizing signal, the delay of one-half the period of said first frequency,
said logic means including logic OR gate means connected to said first and second means for receiving output signals from said holding means and from said shift register means,
whereby said second component of the second switching function incorporates a double frequency repetition of the error component of the switching function at said first frequency as output by the latching means.

14. A gain switching arrangement for providing a plurality of gains to a varying input signal comprising:
(a) first path means for conveying said input signal through a first gain producing circuit and for providing a first gain thereto,
(b) second path means for conveying said input signal through a second circuit having a second gain different from said first gain,
(c) output means,
(d) switching means for selectively switching said input signal through said first or said second path to said output means responsively to a switching signal, and
(e) control means for generating said switching signal and for controlling said switching means to select a specific path for conveying said input signal to said output means,
(f) said control means including
 (i) comparing means for comparing an instantaneous value of said input signal with a threshold value and
 (ii) signal providing means responsive to said comparing means for providing said switching signal and for causing said first or second paths to be selected by said switching means for conveying said input signal to said output means.

15. An arrangement as recited in claim 14 wherein said first path comprises operational amplifying means with an output for providing said first gain to said input signal, said comparing means being connected to the output of said operational amplifying means for comparing an amplified value of said input signal with said threshold value.

16. An arrangement as recited in claim 14 wherein said control means further comprises latching means for retaining the result of said comparison for a selected period of time and for providing an output representative thereof, and connecting means for controlling said switching means responsively to said latching means output.

17. An arrangement as recited in claim 16 wherein said signal providing means comprises error reducing means for reducing output errors due to interaction between components having a common frequency, of said input signal and of said output of said latching means.

18. An arrangement as recited in claim 17 wherein said error reducing means comprises delay means for delaying said latching means output by a submultiple of the period of said common frequency and combining means for combining said latching means output with the delayed latching means output to provide a control signal component for said switching signal at a multiple of said common frequency.

19. An arrangement as recited in claim 18 wherein said delay means comprises shift register means connected to said latching means and providing an output, and said combining means comprises logic gate means connected to receive the output of said shift register means and the output of said latching means, for providing said control signal at a frequency which is a multiple of said common frequency.

20. An arrangement as recited in claim 19 wherein said shift register means is provided with a predetermined number of stages and with a predetermined clock frequency to store the output of said latching means for one half the period of said common frequency, whereby said gate means outputs said control signal at double the common frequency.

21. An arrangement as recited in claim 18 further comprising analog-to-digital converting means having output signals;

sample-and-hold means for selectively providing either samples of said input signal from said switching means or samples of a second input signal to said analog-to-digital converting means, and multiplying means for multiplying the output signals of said analog-to-digital converting means.

22. An arrangement as recited in claim 21 wherein said multiplying means is connected to receive the control signal output by said combining means to determine a scale factor for products produced thereby corresponding to the gain provided to said first mentioned input signal in said first or said second path means.

23. An arrangement as recited in claim 22 further comprising first input means connected for receiving a first signal and for providing that signal to said first or second path means, second input means for receiving said second input signal, one of said first and second input means being connected to receive a current input signal and the other being connected to receive a voltage input signal, one of said first and second input means connected to said first and second path means, said first and second input means connected to said sample-and-hold means, said multiplying means providing a product representative of electrical power associated with said voltage and current inputs.

* * * * *